(12) United States Patent
Jiang

(10) Patent No.: US 8,541,838 B2
(45) Date of Patent: Sep. 24, 2013

(54) MONOLITHICALLY-INTEGRATED DUAL SURGE PROTECTIVE DEVICE

(75) Inventor: Yanfeng Jiang, Beijing (CN)

(73) Assignee: North China University of Technology, Beijing (CN)

( * ) Notice: Subject to any disclaimer, the term of this patent is extended or adjusted under 35 U.S.C. 154(b) by 0 days.

(21) Appl. No.: 13/340,874

(22) Filed: Dec. 30, 2011

(65) Prior Publication Data

US 2012/0175704 A1 Jul. 12, 2012

(30) Foreign Application Priority Data

Jan. 7, 2011 (CN) .......................... 2011 1 0003046

(51) Int. Cl.
*H01L 29/66* (2006.01)
(52) U.S. Cl.
USPC .................................. 257/337; 257/E27.016
(58) Field of Classification Search
CPC ............. H01L 27/088; H01L 29/7835; H01L 29/1095
USPC ................. 257/237, 328, 551, E27.016, 337
See application file for complete search history.

(56) References Cited

U.S. PATENT DOCUMENTS

| | | | | |
|---|---|---|---|---|
| 5,365,099 A | * | 11/1994 | Phipps et al. | 257/328 |
| 5,521,410 A | * | 5/1996 | Yamamoto | 257/342 |
| 5,963,407 A | * | 10/1999 | Fragapane et al. | 361/42 |
| 2004/0095699 A1 | * | 5/2004 | Kohno | 361/100 |
| 2006/0071276 A1 | | 4/2006 | Zundel et al. | |
| 2009/0268357 A1 | | 10/2009 | Reynders et al. | |
| 2012/0139420 A1 | * | 6/2012 | Lee et al. | 315/122 |

* cited by examiner

*Primary Examiner* — Nikolay Yushin
(74) *Attorney, Agent, or Firm* — Charles E. Bruzga; Bruzga & Associates

(57) ABSTRACT

A monolithically-integrated dual surge protective device and its fabrication method are disclosed. The exemplary dual surge protective device includes a LDMOS device and a diode assembly which is consisted of multiple diodes series-wound on back-to-back basis and whose one end is connected to drain electrode of the LDMOS device and the other end is connected to gate electrode of the LDMOS device. The diode assembly can be fabricated directly in the gate electrode area of the LDMOS device after fabrication of the LDMOS device is completed. The protective device is equivalent to combination of diodes and LDMOS in respect to operating principles and structures, with the advantage of enhanced effect of surge prevention and cost reduction of surge device as it can be integrated into a chip.

6 Claims, 3 Drawing Sheets

MONOLITHICALLY-INTEGRATED DUAL SURGE PROTECTIVE DEVICE

CROSS-REFERENCE TO RELATED APPLICATIONS

This application claims priority to Chinese Patent Application No. 201110003046.5, filed on Jan. 7, 2011, the disclosure of which is herein incorporated herein by reference.

FIELD OF THE INVENTION

This field relates to a type of surge protective device, more specifically, a type of monolithically-integrated dual surge protective device and its fabrication method

BACKGROUND OF THE INVENTION

In electronic equipment and systems, there is always some voltage leap, even external interruption, such as static electricity, etc. These types of transient over-voltage are referred as "surge" in general which will affect reliability of the electronic devices and systems. There are many (transient voltage suppressor) TVS devices in the markets, which are used to eliminate the abrupt transient over-voltage.

In the general knowledge available to persons of ordinary skill, the TVS element is generally an $N^+P^+$ zener diode or ceramic voltage-variable resistor and adopts the principle of current division that before the protected device or system breaks down, the protector breaks down to guide the current out for the purpose of protecting the subsequent sections. The several TVS devices so far are diode type TVS device, gas discharge tube, crystal tube TVS device, filter, etc.

There are at least the following defects existing in many conventionally known surge protectors: for example, a device having a single structure and split pattern can only prevent surges of a single form. In practical use, multiple surge protectors on series basis are often adopted to protect system safety so as to meet system demand. Moreover, many conventional surge protectors cannot be integrated within system chips. There remains a need for improved surge protectors.

SUMMARY OF THE INVENTION

In one preferred example, a monolithically-integrated dual surge protective device, comprises a LDMOS device, and a diode assembly which comprises multiple diodes series-wound on back-to-back basis in the following sequence:
-N-P- . . . -N-P-N-P-N- . . . -P-N-; wherein one end of the diode assembly is connected to a drain electrode of the LDMOS device and the other end is connected to a gate electrode of the LDMOS device.

In one preferred embodiment, a method of fabricating the monolithically-integrated dual surge protective device includes the steps of depositing a polysilicon layer having a thickness of 0.5 to 3 microns on a gate oxide layer of the LDMOS device using chemical vapor deposition and mixing a P-type dopant, such as boron, to form P-type polysilicon during the deposition; using photo-etching to define an N-type regions on the polysilicon and using ion injection to inject an N-type dopant, such as phosphorous ions, to form N-type regions in a section; depositing a passivation layer above said polysilicon layer; and connecting a first end of the diode directly to the gate electrode and a second end of drain electrode of the LDMOS device during a process of metallization.

BRIEF DESCRIPTION OF THE FIGURES

Further features and advantages of the invention will become apparent when the following detailed description is read in view of the drawing figures, in which.

DETAILED DESCRIPTION OF THE INVENTION

Figure 1:
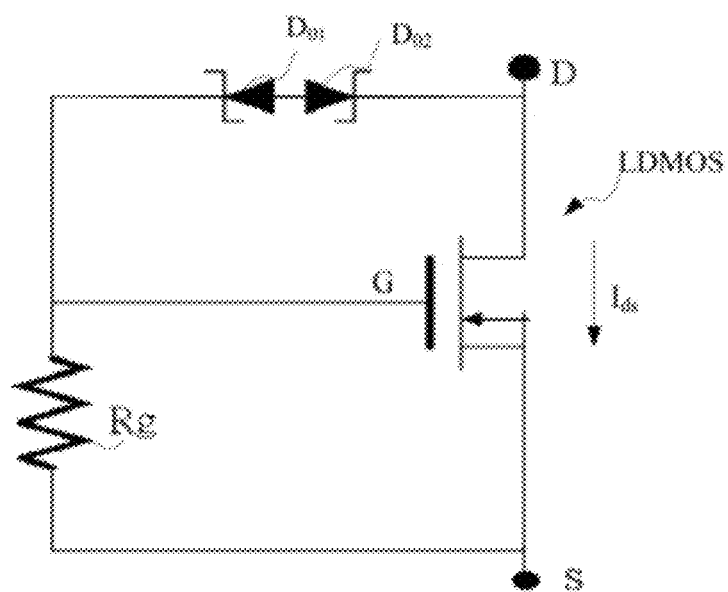
FIG. 1 shows an equivalent circuit diagram of an exemplary monolithically-integrated dual surge protective device.

The examples and drawings provided in the detailed description are merely examples, which should not be used to limit the scope of the claims in any claim construction or interpretation.

The term LDMOS" is an abbreviation for laterally diffused metal oxide semiconductor.

One object of the invention, among many, is to provide a monolithically-integrated dual surge protective device, which can enhance effect of surge prevention and can be integrated on a chip, and its fabrication method.

For an exemplary monolithically-integrated dual surge protective device, the detailed preferred embodiments include a LDMOS device and a diode assembly which comprises multiple diodes series-wound on back to back basis in the following sequence: -N-P- . . . -N-P-N-P-N- . . . -P-N-.

One end of the diode assembly is connected to the drain electrode of the LDMOS device and the other end is connected to gate electrode of the LDMOS device.

The diode assembly is fabricated and formed on thin film polysilicon by means of ion injection technique. More specifically, the diode assembly can be fabricated on gate oxide layer between the drain electrode and gate electrode of the LDMOS device.

The width-to-length ratio of channel of the LDMOS device is preferably 10 or more. For example, the length and width of the channel of the LDMOS device are 5 and 50 microns respectively.

In one example, an exemplary protective device can have multiple parallel connections.

For an exemplary fabrication method of an exemplary monolithically-integrated exemplary dual surge protective device, in one example, the diode assembly is fabricated in the gate electrode area of the LDMOS device after fabrication of the LDMOS device is completed, including the following steps in detail:

First, one polysilicon layer with thickness of 0.5 to 3 micron(s) is deposited on gate oxide layer of the LDMOS device by means of chemical vapor deposition and a P-type dopant, such as boron, is mixed to form P-type polysilicon during the deposition.

Then, photo-etching is adopted to define N-type regions on the polysilicon and ion injection is adopted to inject N-type dopant, such as phosphorous ions, to form n region in this section.

Then, one passivation layer is deposited above the polysilicon layer.

Finally, during metallization, the two ends of the diode are connected directly to the gate electrode and the drain electrode of the LDMOS.

In one example, the dosage concentration of the boron is $10^{18}/cm^3$ and that of the phosphorous ions is $10^{19}/cm^3$.

In one example, the monolithically-integrated dual surge protective device is equivalent to combination of diodes and LDMOS in respect to operating principles and structures, with the advantage of the effect of enhancing of surge prevention and cost reduction of surge device since it can be integrated into a chip. The device has two protection mechanisms for surge prevention whose protection effects are better than the surge prevention devices with a single mechanism. In addition, the device can be integrated into an integrated circuit such that cost of external elements is avoided.

In one example as shown in FIG. 1, an equivalent circuit of structure of the surge protective device includes a parallel connection of a LDMOS device and an equivalent diode assembly, which is multiple diodes series-wound on back-to-back basis and is formed on the polysilicon thin film by means of ion injection. Diodes are shown as $D_{01}$, and $D_{02}$. One end is connected to the drain electrode D of the LDMOS device and the other end is connected to gate electrode of the LDMOS device.

As shown in FIG. 1, a parasitic resistance between gate electrode G and source electrode S is shown as Rg.

Figure 2:
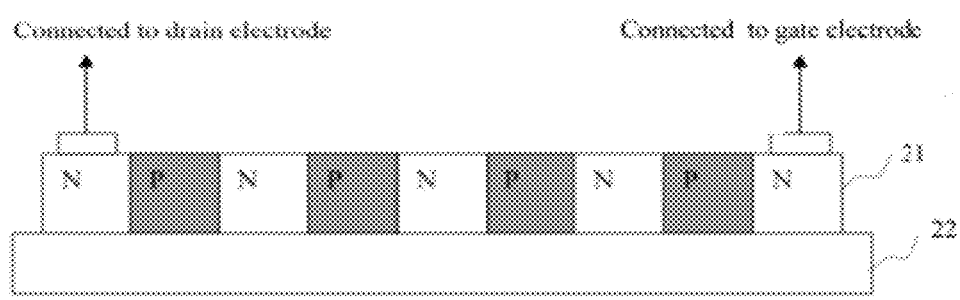
FIG. 2 shows an exemplary cross-sectional view of a diode.

FIG. 2 shows an exemplary structure of a diode which is fabricated with the polysilicon thin film 21, with one end connected to the drain electrode of the LDMOS device and the other end connected to gate electrode of the LDMOS device. As shown in FIG. 2, polysilicon thin film 21 is deposited above oxide layer 22.

Figure 3:
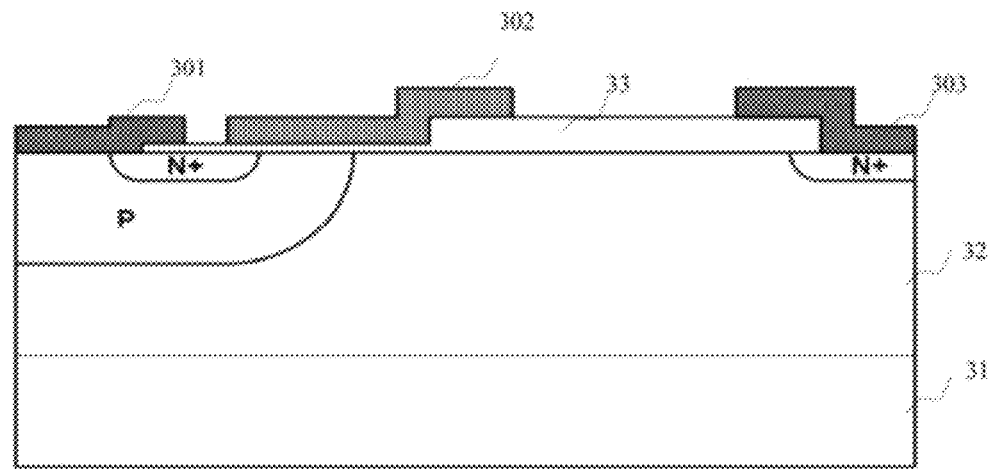
FIG. 3 shows a structure schematic of a basic profile of an exemplary LDMOS device.

In one example shown in FIG. 3, the main device is a LDMOS device, with its profile structure as shown. LDMOS is a device developed from DMOS, i.e., double-diffused metal-oxide-semiconductor. As implied by its name, LDMOS (laterally diffused metal oxide semiconductor) is a transverse MOSFET, i.e., a metal-oxide-semiconductor field-effect transistor and comprises source electrode, gate electrode, drain electrode, substrate, etc. Its fundamental principle is to control current between the source electrode and the drain electrode by means of the gate electrode.

In one example, as shown in FIG. 3, a main fabrication process of the protective device proceeds as follows:

First, as shown in FIG. 3, fabrication of LDMOS is based on the same process as CMOS, i.e., complementary metal-oxide-semiconductor. Resurf (to reduce superficial electric field) structure or field-limiting ring structure can be considered regarding to requirements of the specific fabrication process. As shown in FIG. 3, LDMOS device comprises source electrode 301, gate electrode 302, drain electrode 303, P type substrate 31, N-type drift region 32, and gate oxide layer 33.

After fabrication of LDMOS device is completed, the exemplary diode shown in FIG. 2 is fabricated in the gate electrode area, with the specific process adopted as follows:

First, one polysilicon layer with thickness of 0.5 to 3 micron(s) is deposited on gate oxide layer 33 by means of chemical vapor deposition, and boron with concentration of about $10^{18}/cm^3$ is mixed to form P-type polysilicon during the deposition.

Photo-etching is used to define an N-type regions on the polysilicon and ion injection is adopted to inject phosphorous ions with concentration of about $10^{19}/cm^3$ to form n region in this section.

One passivation layer is deposited above the polysilicon layer.

Figure 4:
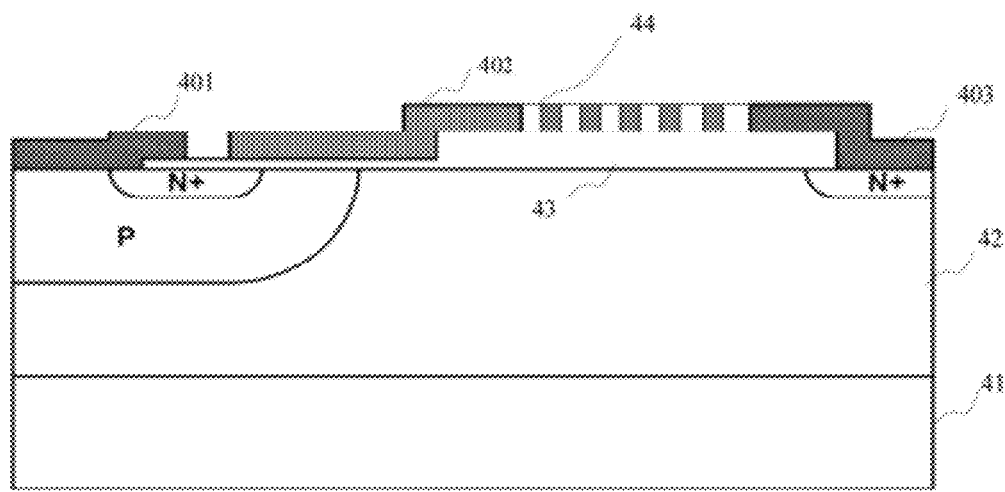
FIG. 4 shows a structure schematic of the profile of an exemplary monolithically-integrated dual surge protective device.

During metallization, the two ends of the diode are connected directly to the gate electrode 302 and the drain electrode 303 of the LDMOS, respectively, to finally form the structure as shown in FIG. 4.

FIG. 4 shows an exemplary structure of the surge protective device, in which the diode section 44 is series-wound by multiple diodes which are connected on back-to-back basis, with the specific structure as shown in FIG. 2. The shaded section represents P-type regions. Specific number of diodes in series in FIG. 4 is determined by voltage range to be protected. As shown in FIG. 4, LDMOS device comprises source electrode 401, gate electrode 402, drain electrode 403, P type substrate 41, N-type drift region 42, and oxide layer 43.

In the detailed embodiments, if it is assumed the breakdown voltage is 40V, the designed breakdown voltage of LDMOS is 40V, the corresponding threshold voltage is 2.73V, breakdown voltage of the diode is designed to be 15.7V and the maximum breakdown current is 90 mA.

For a LDMOS device, the width-to-length ratio is above 10 to ensure large $I_{DS}$, so as to take away surge current in short time. In a specific embodiment, the length and width of the channel are 5 and 50 microns respectively in design. However, other embodiments are allowable.

In an exemplary working principle, if it is assumed there is a surge, with surge voltage of 50V and response time of 20 microseconds, then the voltage first exceeds the breakdown voltage of the diode of 15.7V, resulting in breakdown of the diode with current flowing past. Meanwhile, the voltage continues to rise and current of the diode will flow past the parasitic resistor Rg shown in FIG. 1. When the voltage drop generated on the resistor due to the current is more than threshold voltage of LDMOS, break-over occurs to the LDMOS device, resulting in the current being broken over from the drain end to the source end to realize protection.

The surge protective device and method also apply to conditions when large current protection is required. Multiple units of the structure shown in FIG. 4 can be connected in parallel. Multiple parallel connections can provide protection for large current. For example, when 10 units with the same structures are connected in parallel, the corresponding device can bear the current of above 180 mA.

Figure 5:
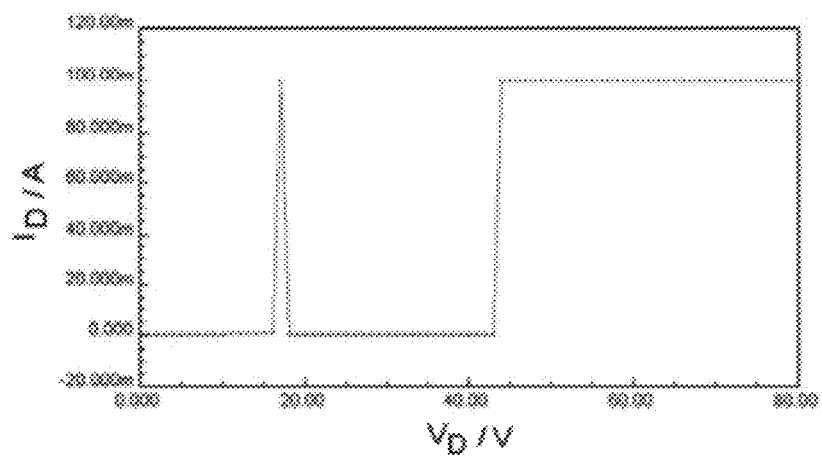
FIG. 5 shows a curve of current variation along with the voltage rising at a drain electrode of an exemplary monolithically-integrated dual surge protective device along with voltage rising at the drain electrode.

FIG. 5 shows the curve of current variation along with the voltage rising at the drain electrode of an exemplary device. It can be seen that the curve is consistent with the designed results. When voltage reaches 15.7V, the current rises abruptly, resulting in breakdown of the diode. After discharge of part of the surge current, voltage of the corresponding gate electrode reaches the threshold voltage, resulting in breakdown and break-over of the LDMOS device. The breakdown voltage then is 40V along with the current discharge, meeting the specific requirements for circuit protection.

While the principles of the invention have been described herein, it is to be understood by those skilled in the art that this description is made only by way of example and not as a limitation as to the scope of the invention. Other embodiments are contemplated within the scope of the present invention in addition to the exemplary embodiments shown and described herein. Modifications and substitutions by one of ordinary skill in the art are considered to be within the scope of the present invention, which is not to be limited except by the following claims.

What is claimed is:
1. A monolithically-integrated dual surge protective device, comprising:

a) a Laterally Diffused Metal Oxide Semiconductor (LDMOS) device, and a diode assembly which comprises multiple diodes series-wound on back to back basis in the following sequence:

N-P- . . . -N-P-N-P-N- . . . -P-N-;

b) one end of the diode assembly being connected to a drain electrode of the LDMOS device and the other end is connected to a gate electrode of the LDMOS device;
c) the breakdown voltage of the diode assembly being selected below the breakdown voltage of the semiconductor device, so that, when a surge voltage in excess of the breakdown voltage of the LDMOS device occurs, the diode assembly breaks down to protect the LDMOS device; and
d) the diode assembly being arranged so that current through said assembly can flow through a resistance between the gate electrode and a source electrode of the LDMOS device and cause a voltage drop across said resistance that exceeds the threshold voltage of the LDMOS device, so as to cause break-over of the LDMOS device with resulting current being broken over from the drain electrode to the source electrode, so as to further protect the LDMOS device.

2. The monolithically-integrated dual surge protective device of claim 1, wherein the diode assembly is fabricated and formed on a polysilicon thin film by means of ion injection technique.

3. The monolithically-integrated dual surge protective device of claim 2, wherein the diode assembly is fabricated on a gate oxide layer between the drain electrode and gate electrode of the LDMOS device.

4. The monolithically-integrated dual surge protective device of claim 3, wherein a width-to-length ratio of a channel of the LDMOS device is 10 or more.

5. The monolithically-integrated dual surge protective device of claim 4, wherein a length and width of a channel of the LDMOS device are 5 and 50 microns, respectively.

6. The monolithically-integrated dual surge protective device of claim 1, wherein said resistance is the parasitic resistance between the gate electrode and a source electrode of the LDMOS device.

* * * * *